United States Patent [19]
Rodder

[11] Patent Number: 5,918,145
[45] Date of Patent: Jun. 29, 1999

[54] METHOD OF FORMING A MICROELECTRONIC DEVICE INCORPORATING LOW RESISTIVITY STRAPS BETWEEN REGIONS

[75] Inventor: Mark S. Rodder, University Park, Tex.

[73] Assignee: Texas Instruments Incorporated, Dallas, Tex.

[21] Appl. No.: 08/481,900

[22] Filed: Jun. 7, 1995

Related U.S. Application Data

[62] Division of application No. 08/342,400, Nov. 18, 1994, Pat. No. 5,475,266, which is a continuation of application No. 08/149,147, Nov. 5, 1993, abandoned, which is a continuation of application No. 07/840,379, Feb. 24, 1992, abandoned.

[51] Int. Cl.⁶ .................... H01L 211/3205; H01L 21/324
[52] U.S. Cl. ......................... 438/622; 438/682; 438/649
[58] Field of Search ..................... 437/191, 193, 437/195, 200, 201; 438/618, 622, 630, 648, 649, 682, 683

[56] References Cited

U.S. PATENT DOCUMENTS

| | | |
|---|---|---|
| 4,833,519 | 5/1989 | Kowano et al. .................. 437/195 |
| 4,866,009 | 9/1989 | Matsuda ......................... 437/203 |
| 4,874,719 | 10/1989 | Kurosawa ....................... 437/195 |
| 4,968,645 | 11/1990 | Boldi et al. ..................... 437/200 |
| 5,079,617 | 1/1992 | Yoneda .......................... 257/755 |
| 5,231,052 | 7/1993 | Lu et al. ........................ 437/193 |
| 5,250,472 | 10/1993 | Chen et al. .................... 437/195 |
| 5,326,714 | 7/1994 | Liu et al. ....................... 437/200 |
| 5,378,654 | 1/1995 | Hsue ............................. 437/195 |

*Primary Examiner*—John F. Niebling
*Assistant Examiner*—Ha Tran Nguyen
*Attorney, Agent, or Firm*—Carlton H. Hoel; W. James Brady; Richard L. Donaldson

[57] ABSTRACT

A microelectronic device (10) provides decreased use of bar area to form contacts between a conductive strap (24) or interconnect and subsequent levels. The conductive strap comprises a conducting layer (130) and an overlying semiconducting layer (132). Connection to subsequent levels is made generally overlying substrate conductive areas such as a gate (14) and/or a moat (16). Connection to conductive sublayer (130) is accomplished by doping an overlying semiconductor sublayer (132). Any counter-doping of substrate conductive areas is blocked by an overlying well of dopant-masking (33) or sufficiently thick semiconducting (32) material.

16 Claims, 3 Drawing Sheets

METHOD OF FORMING A MICROELECTRONIC DEVICE INCORPORATING LOW RESISTIVITY STRAPS BETWEEN REGIONS

This is a divisional of application Ser. No. 08/342,400, filed 11/18/94 now issued as U.S. Pat. No. 5,475,266; which is a continuation of application Ser. No. 08/149,147, filed 11/05/93. now abandoned, which is a continuation of application Ser. No. 07/840,379 filed Feb. 24, 1992 now abandoned.

BACKGROUND OF THE INVENTION

This invention relates to microelectronic devices incorporating conductive, connecting straps. More particularly, it is concerned with the method and structure for forming such a device incorporating low-resistivity straps between conductive regions.

The growing use of suicides (e. g. titanium silicide) in microelectronic devices is well known. Silicides, among other uses, are used to diminish contact resistivity for conductor regions such as at moats and gates. Silicides are also used for the formation of local interconnects or straps to reduce sheet resistivity in the interconnect. One method of using silicides simultaneously for these types of applications is to lay down a blanket of titanium (or other silicide-forming metal) followed by a blanket of less conductive material, for example noncrystalline silicon. The noncrystalline silicon and titanium is then patterned so that it remains only where the straps are to be formed. Then the titanium is reacted with the overlying noncrystalline silicon to form titanium silicide. Titanium also reacts with underlying polysilicon and silicon at various sites, not only where local interconnects are formed but at other sites.

To make subsequent contact to other circuit elements (e. g. poly-silicon or poly-Si conductors, poly-Si drain/source regions, poly-Si resistors, metal level conductors), typically the noncrystalline silicon contains dopant which forms an electrical connection from the top surface of the noncrystalline silicon to the underlying titanium silicide. One method of making said subsequent contacts is to deposit doped noncrystalline silicon as the layer reacted with and overlying the titanium silicide.

Another method is to overlay the titanium with an undoped noncrystalline or polycrystalline layer, and selectively dope the areas where a connection is desired.

One problem that has been found with the technique of forming straps and silicided moats and gates simultaneously is that such a method constrains the initial titanium deposition to be a certain minimum thickness in order to achieve acceptable silicide sheet resistivity at moats, gates, and any other site where the silicide is to be formed. Another problem is that since titanium is blanket deposited for simultaneous creation of contacts and straps, one area of the device cannot be silicide-connected to another if an unrelated, exposed conductor is interposed. That is to say, such an interconnect would be shorted to the interposing unrelated conductor. Another problem is that the patterned etch of the overlying noncrystalline silicon must substantially stop on the underlying titanium to maintain a desired titanium thickness over moat and gate regions after etch. However, the selectivity of the silicon etch to underlying titanium is not large such that substantial loss of titanium can result during the silicon etch. Additionally, for thin titanium, the silicon etch might etch through the underlying titanium and even etch into the underlying silicon moat regions. Yet another problem with this technique is that titanium necessarily reacts with underlying materials such as oxide in locations without overlying noncrystalline silicon. This reaction with other materials such as oxygen or nitride could lead to the formation of compounds not as easily removed— for example titanium oxide or titanium oxide nitride (Ti— O—N). Filaments of such undesirable compounds as titanium oxide nitride may not be easily removed and can often lead to undesirable shorting.

Another problem that has been discovered relates to connecting two or more connected conductor regions of semiconductor doped with different impurity type and making a further interlevel connection with subsequently formed circuit elements. One method of connecting the conductor regions while enabling further interlevel connections is to deposit doped noncrystalline silicon. In that instance, during subsequent processing steps, the impurities from the overlying doped deposited noncrystalline silicon can diffuse through the titanium silicide, possibly resulting in counter-doping an adjacent conductor region of opposite doping type. Another method existing in the prior art for making subsequent interlevel connection is to deposit undoped noncrystalline silicon, and subsequently mask and dope to make electrical connection from the underlying silicide to the top surface of the undoped noncrystalline silicon. If it is desired to use arbitrary or only a single-type dopant for the interlevel connections, then such connections cannot be made directly above underlying circuit elements without carrying the aforementioned counterdoping risks. Such a connection scheme requires additional, non-overlying, area be allocated for the interlevel connections. Another problem with this method is that a mask must be used to add dopants to the undoped noncrystalline silicon.

What is needed then is a method which allows for formation of silicided interconnects yet also allows the silicided interconnect to be as thin as necessary. This allows the interconnects to practically overlie unrelated conductors. Also needed is a method wherein titanium will not be reacted in such a manner as to form undesirable compounds which cannot be removed and possibly resuet in undesired shorting. Also needed is a method whereby the interconnect can be patterned and etched with high selectivity to underlying layers. Furthermore, a method is needed for which a silicided interconnect can be formed independently of gate and moat silicidation.

Additionally, a method is needed which allows for formation of silicided interconnections, yet also allows inter-level connections to be placed above circuit elements, without counterdoping said circuit elements -and without requiring additional bar area, regardless of doping process or dopant type. In the preferred embodiment, this process is self-aligning to underlying circuit elements, and does not require any additional masking step for the doping process.

SUMMARY OF THE INVENTION

The problem outlined above is in large measure solved by the microelectronic device in accordance with the present invention. That is to say, the device hereof provides a distinct silicide formation for purposes of forming a silicided local interconnect, allows interconnects to effectively overpass unrelated conductors, provides a method to obviate undesirable nonsilicon titanium reactions during strap formation, provides a method to etch the interconnect with high selectivity to underlying layers, and allows interlevel connections to be placed above underlying circuit elements without additional masking steps.

The microelectronic device in accordance with the present invention also provides a substrate having a first conductive area and a second conductive area. A first insulating layer is selectively formed over the substrate so as not to cover predetermined portions of the first and second conductive areas, where the openings above the conductive areas have sides that are predominantly vertical. A conducting strap connects the first and second conductive areas. The conducting strap or local interconnect may include a reacted sublayer, (preferably a silicide) and may include an unreacted sublayer, preferably undoped noncrystalline silicon. The fact that the strap is silicided lowers the contact resistivity between the strap and the first and econd conductive areas, respectively, and also lowers the sheet esistivity of the strap itself.

Furthermore, the device hereof provides for use of silicon to be the silicide-overlying material, while providing a generally vertical connection from the conductor region that allows subsequent dopant implantation to occur directly above this region without any risk of counterdoping. The openings above the conductive regions may either be covered by the unreacted noncrystalline silicon of sufficient depth to prevent impurities from any subsequent doping operation from penetrating into the underlying conductive region, may be covered by a second insulating layer, or may be covered by some combination of the unreacted sublayer and the second insulating layer. In the preferred embodiment, the second insulating layer serves as a self-aligned mask for subsequent doping operations. In any case the geometry of the device will serve to prevent doping impurities from reaching the conductive regions.

In preferred embodiments a silicide-forming metal is reacted with silicon to form the silicide sublayer, while the overlying silicon sublayer substantially includes undoped noncrystalline silicon. The first and second insulating layers in preferred embodiments substantially include oxide.

BRIEF DESCRIPTION OF THE DRAWINGS

Corresponding numerals and symbols in the different figures refer to corresponding parts unless otherwise indicated.

DESCRIPTION OF THE PREFERRED EMBODIMENTS

Figure 1A:
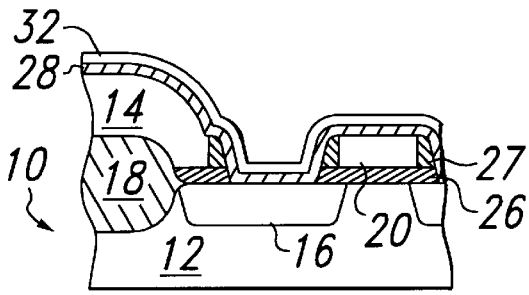
FIGS. 1a–1d, in partial cross section, illustrate progressive formation of a microelectronic device formed in accordance with the prior art.

Referring now to the drawings in general and FIG. 1a in particular, the method of manufacturing device 10 of the prior art will now be described. Substrate 12 is typically formed of a monocrystalline silicon wafer. Substrate 12 is formed so as to include a field oxide 18. Substrate 12 further includes a gate oxide 26, a doped moat 16, a doped gate 14, doped, unrelated gate 20 and sidewall oxides 27. A silicide-forming metal layer 28, for example titanium, is formed and then a noncrystalline silicon layer 32 is formed over the metal layer 28 as shown.

Figure 1B:
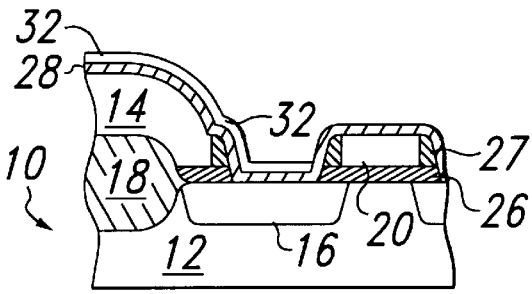

Referring to FIG. 1b, noncrystalline silicon layer 32 is then patterned and etched as shown with the etch of layer 32 substantially needing to stop on layer 28. Noncrystalline silicon layer 32 may be intrinsic or is appropriately doped for the application—either p-type or n-type in a manner well known in the art.

Figure 1C:
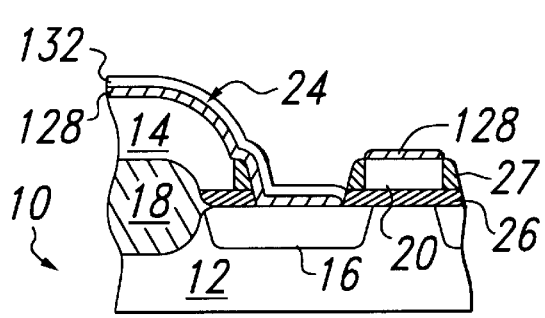

Referring to FIG. 1c, titanium layer 28 is reacted, typically by annealing, with overlying noncrystalline silicon layer 32 and underlying silicon and polysilicon to form titanium silicide sublayer 128. The structure resulting from the reaction includes strap 24 having a sublayer 132 of unconsumed noncrystalline silicon and silicide sublayer 128. Note the formation of silicide 128 at other areas such as at the top of unrelated gate 20. It should also be noted that although titanium layer 28 is graphically depicted in a substantially similar manner as titanium silicide sublayer 128 the two are chemically and electrically different.

Figure 1D:
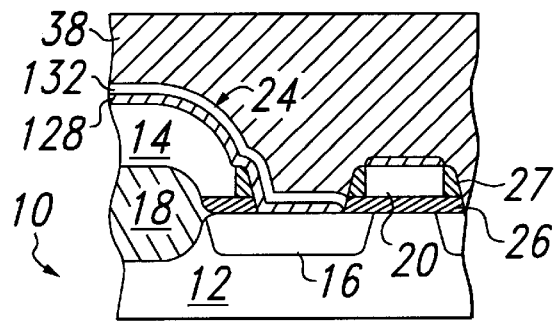

Referring to FIG. 1d, overlying insulator 38 is then formed over the resulting structure to complete microelectronic device 10. It should be noted that other aspects of device have not been shown which would require other steps well understood in the art such as formation of bonding pads, etc.

The disadvantage of the prior art device 10 will be noticed in FIG. 1b in that only noncrystalline silicon layer 32 is patterned but titanium layer 28 cannot be completely patterned. In other words the titanium must be left at sites for formation of silicide such as at unrelated gate 20. Thus in FIG. 1c it will be noted that the titanium is reacted to simultaneously silicide moat 16 and gate regions 14, 20 as well as to form strap 24 between gate 14 and moat 16.

As mentioned above, another disadvantage is the low etch selectivity between titanium and silicon. Hence, the etch required to arrive at the structure may result in damage underlying the exposed portions of titanium layer 28.

Figure 2:
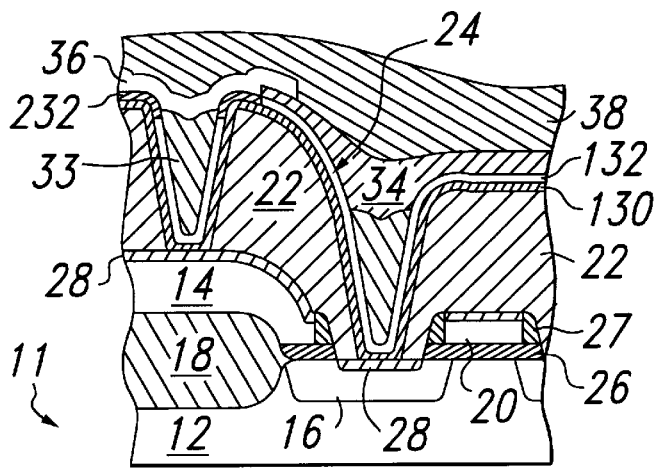
FIG. 2, in partial cross section, illustrates preferred embodiment of the present invention.

Referring now to the present invention and FIG. 2 in particular, a microelectronic device 11, incorporating low-resistivity straps between conductive regions, in accordance with the invention, is partially depicted. Device 11 includes a substrate 12 having a gate or first region 14, a moat or second region 16, a field oxide 18, and an unrelated gate 20. Device 11 further includes insulating layer or oxide 22, and a local interconnect or strap 24. Strap 24 electrically connects gate 14 to moat 16 but is not in electrical communication with unrelated gate 20. Within the inventive concept, a strap is a conductor which places two or more integrated circuit regions in electrical communication. Thus a strap can be a local interconnect but may also be any other connective conductor. Although device 11 is illustrated as an SRAM, the inventive strap could be used in any application requiring such a strap, such as in, by way of example but not limited to, an SRAM, DRAM, logic or SOI circuit. In accordance with the present invention, strap 24 provides low contact resistance to gate 14 and moat 16 respectively as well as providing low sheet resistance therebetween. Oxide 22 is formed so as to allow strap 24 to overlie unrelated gate 20 without shorting thereto. Indeed, strap 24 can be connected with other conductors at other portions of device 11 if desired in accordance with the invention. Still further, an oxide 33 is deposited to allow subsequent doping of inter-level connection directly above the integrated circuit regions without risk of counterdoping the integrated circuit regions.

Figure 3:
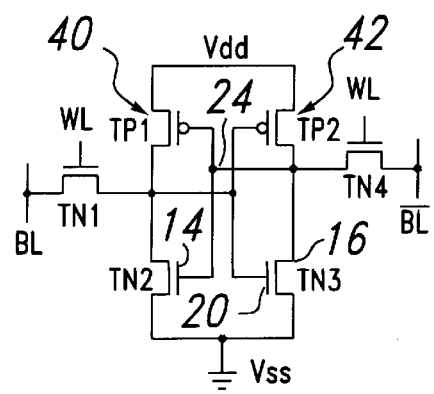
FIG. 3 schematically illustrates a 6T SRAM cell and associated circuitry incorporated in the preferred embodiment of the present invention.

Referring now to FIG. 3, comparison of FIG. 3 to FIG. 2 will help to reveal the portion of the SRAM cell structure depicted in FIG. 2. By reference to FIG. 3, moat 16 is the drain region of transistor TN3 and gate 14 is the gate region of transistor TN2. Strap 24 connects moat 16 to gate 14 and overlies but does not connect to gate region 20 of transistor TN3.

Figure 4A:
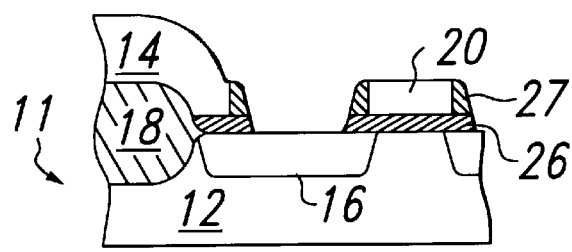
FIGS. 4a–4f, in partial cross section, illustrate progressive steps in the formation of a microelectronic device in accordance with the present invention.

Referring now to FIG. 4a, the method of forming device 11 will now be described. Substrate 12 is preferably substantially formed of a monocrystalline silicon wafer although it will readily be understood that other semiconducting materials (for example gallium arsenide or germanium) could also be used. Substrate 12 is formed so as to include field oxide 18, such formation being well known in the art. Substrate 12 further includes gate oxide 26, doped moat 16, doped gate 14, doped, unrelated gate 20 and sidewall oxides 27. The formation of the elements as depicted in FIG. 4a is well known to those skilled in the art and thus will not be described in greater detail. It should be noted that geometric configurations and proportions are not drawn to scale and should not be interpreted in any of the figures as limiting the scope of the invention.

Figure 4B:
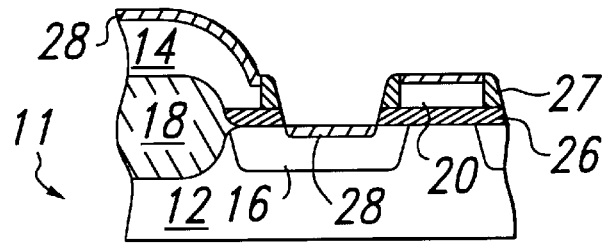

Referring to FIG. 4b, a silicide-forming metal, for example titanium, is blanket deposited. The titanium is then reacted with the underlying silicon regions (and selected titanium is removed) to form a self-aligned titanium silicide 28 as shown. It should be further noted that any other silicide-forming metal could be used as suited to a given application, such applications being well understood in the art. Typically, a silicide may be formed by reaction of titanium and silicon at 700° C. for 30 minutes in a nitrogen ambient.

Figure 4C:
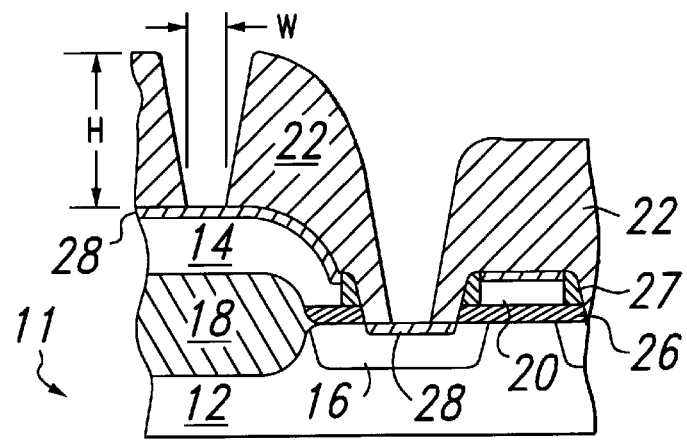

Referring to FIG. 4c, insulator layer 22 is formed and patterned to expose a contact window designated W and a sidewall height H as shown. Insulating layer 22 can be any of a number of combinations of insulating material well known in the art. In the preferred embodiment the insulating material is oxide.

Figure 4D:
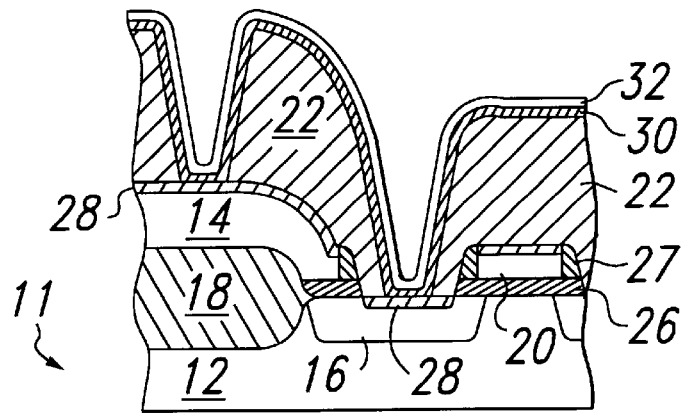

Referring to FIG. 4d, a layer of conductive, substratereactive material 30 is formed. In the preferred embodiment, substrate-reactive material 30 is titanium. However, materials other than titanium which are reactive with a given underlying substrate could also be used. In the preferred embodiment, the reacted material (discussed below) is a silicide but the invention is not limited to this. Then a layer of semiconductor material 32, such as noncrystalline silicon, is formed. In the preferred embodiment, the semiconductor material 32 is a noncrystalline silicon layer, however a semiconductor material other than silicon could be used, and indeed if a nonsilicon substrate were used, a nonsilicon semiconductor might be more appropriate. Silicon layer 32 is formed to a thickness in a range of about 500–2,500 Å. Titanium layer 30 and noncrystalline silicon layer 32 may then be patterned and etched to form discrete conductive elements (not shown).

Figure 4E:
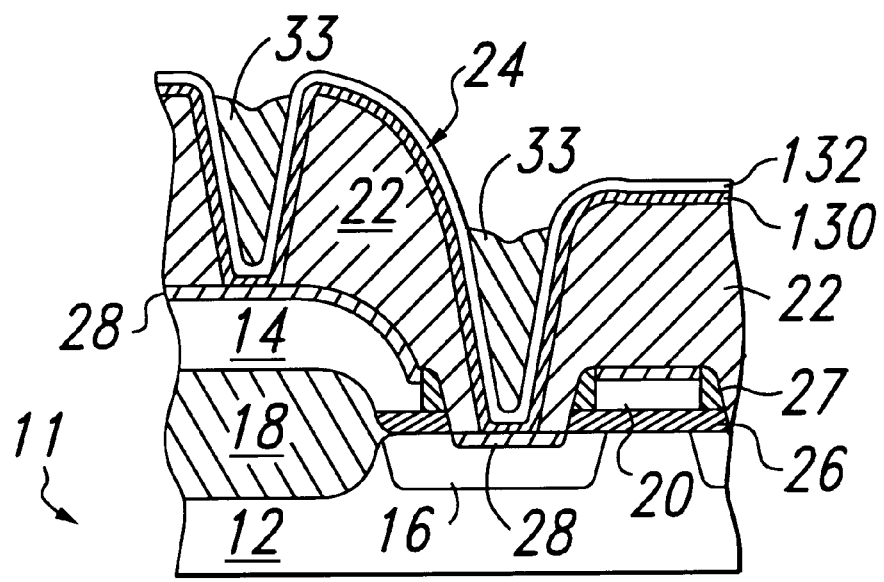

Referring to FIG. 4e, second titanium layer 30 is reacted with noncrystalline silicon layer 32 to form strap 24 which includes a reacted sublayer or titanium silicide layer 130 and noncrystalline silicon sublayer 132. In the course of the reaction a certain proportion of the noncrystalline silicon from noncrystalline silicon layer 32 is consumed and thus it will be understood that the original noncrystalline layer 32 has a greater thickness than the resulting noncrystalline sublayer 132. It should also be noted that although the second titanium layer 30 is graphically depicted in substantially the same manner as titanium silicide sublayer 130, the two are chemically and electrically quite different.

Still referring to FIG. 4e, an insulating layer 33 is then formed to act as a barrier to any subsequent doping steps. The silicon sublayer 132 can then be blanket doped, if desired, to electrically connect the top surface of silicon sublayer 132 and reacted silicide 130.

Figure 4F:
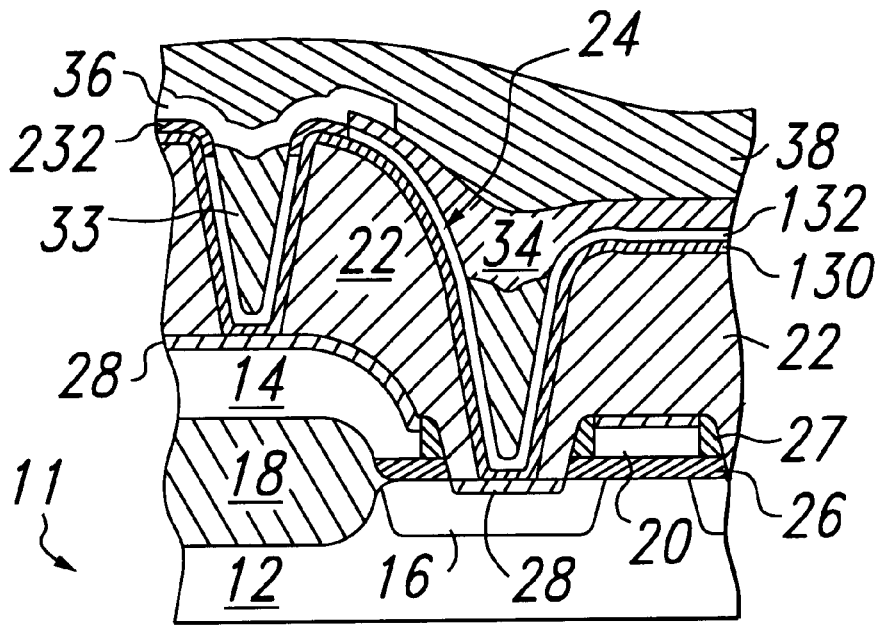

Referring now to FIG. 4f, an insulating layer 34 can then be formed and patterned as required for other portions of device 11. Then region 132 can be implant doped using layer 34 as a partial mask to form an electrically connected area 232. A layer of conductor or semiconductor material 36, preferably noncrystalline silicon, may then be formed and patterned as shown. Layer 36 may be connected to underlying circuit elements 14 or 16 through doped area 232 and titanium silicide layer 130, as shown. Silicon layer 36 may be selectively doped according to the application, as is well understood in the art. Still referring to FIG. 4f, overlying insulator 38 is then formed over the resulting structure to complete microelectronic device 11. It should be noted that other aspects of device have not been shown which would require other steps well understood in the art such as formation of bonding pads, etc.

The benefits of the present invention will now be discussed with reference to FIG. 4f. In prior art, if doping of layers overlying conductive regions such as gate 14 or moat 16, special care would need be taken to avoid counterdoping of these conductive regions. By using a vertical well structure in conjunction with an oxide 33 as a barrier to dopants, subsequent doping of interlevel connections is allowed directly above the conductive regions without such risks of counterdoping.

Still referring to FIG. 4f, in the prior art, if silicide-reacting metal is to be used simultaneously for silicidation of straps and moats (e. g. metal layer 28 of FIG. 1b is used simultaneously for silicidation for strap 24 and moat 16 of FIG. 1c), the initial thickness of the metal layer is constrained by the sheet-resistivity requirements of the moat. For example about 1000 Å of titanium might be required. On the other hand, according to the present invention, only the titanium layer deposited for purposes of forming titanium silicide layer 28 is constrained by sheet-resistivity requirements for the formation of silicide layer 28 in the formation of moat 16 while titanium layer 30 has no such thickness constraints. In other words, titanium layer 30 may be formed much thinner, e.g. in a range of about 100–300 Å is acceptable in some applications.

With reference to FIG. 4f, because of insulating layer 22, strap 24 can be connected to another conductive site e.g. to the right of unrelated gate 20. In the prior art, no such connection to another conductive site would be possible due to shorting problems associated with unrelated gates, as discussed above. Furthermore, insulating layer 22 also has high etch selectivity relative to titanium (as well as other metals and silicon) and thus etching constraints are considerably eased according to the invention.

Although the invention has been described in detail herein with reference to its preferred embodiments and certain described alternatives, it is to be understood that this description is by way of example only, and is not to be construed in a limiting sense. It is to be further understood that numerous details of the embodiments of the invention, and additional embodiments of the invention will be apparent to, and may be made by persons of ordinary skill in the art having reference to this description. It is contemplated that all such changes and additional embodiments are within the spirit and true scope of the invention as claimed below.

I claim:

1. A method of forming a microelectronic device, said device incorporating connecting structures between regions, the method comprising:

a. providing a substrate having a first region;
b. forming a first insulating layer over said substrate;
c. removing selected portions of said first insulating layer so as to at least partially expose said region, forming a cavity above said exposed region
d. forming a layer of semiconductor material on said first insulating layer and said cavity so as to make contact with said first region, said layer of semiconductor material being formed with a thickness sufficient to partially fill said cavity and to prevent dopants from subsequent doping operations from penetrating to said first region;
e. forming a second insulating layer over said semiconductor layer;
f. removing selected portions of said second insulating layer so as to at least partially expose said semiconductor layer; and
g. forming an interconnective layer over said second insulating layer and in electrical communication with said exposed semiconductor layer.

2. The method of Claim 1 and further comprising the step of forming a conductive layer prior to said step of forming said semiconductor layer such that said semiconductor layer and said conductive layer form a single interconnective layer having a bottom, conductive part and a top, semiconductor part.

3. The method of Claim 1 and further comprising the step of forming a third insulating layer prior to said step of forming interconnective layer.

4. The method of claim 3 and further comprising the step of removing selected portions of said third insulating layer over said exposed semiconductor layer, said removal of selected portions of said third insulating layer not significantly removing said second insulating layer.

5. The method of Claim 4 and further comprising the step of doping said semiconductor layer.

6. The method of claim 5 wherein said third insulating layer is formed and patterned prior to said doping step to expose said semiconductor layer such that said third insulating layer acts as a partial mask for said doping step.

7. The method of claim 1 wherein said interconnective layer comprises a doped semiconductor.

8. The method of claim 1 wherein said second layer of insulating material is deposited in a conformal manner over an underlying surface comprising said substrate and said semiconductor layer.

9. The method of claim 8 wherein said underlying surface is of a geometry such that the thickness of said second insulating layer is greater above said first region than above selected electrically connected areas.

10. The method of claim 1 wherein said semiconductor layer is patterned so as to define a conducting strap between said first region and a second region.

11. The method of claim 1 wherein said first interconnective layer is patterned so as to define a conducting strap between said first region and a second region.

12. A method of forming a microelectronic device, said device incorporating connecting structures between regions, the method comprising:
a. providing a substrate having a first region;
b. forming a first insulating layer over said substrate;
c. removing selected portions of said first insulating layer so as to at least partially expose said region, thereby forming an opening above said exposed region, said opening having sidewalls of a first selected height to width ratio;
d. forming a first interconnective layer formed on said insulating layer and upon the sidewalls of said opening such that a cavity is defined by said first interconnective layer upon the sidewalls of said opening; and
e. forming an insulating plug upon said first interconnective layer and within said cavity, said insulating plug partially filling said cavity and acting as a mask to subsequent doping operations thereby preventing dopants from said subsequent doping operations from penetrating to said first region.

13. The method of claim 12 wherein said first interconnective layer further comprises a top part and a bottom part, the top part being a semiconductor and the bottom part being a conductive material.

14. The method of claim 13 and further comprising the step of doping the top part of said first interconnective layer to form an electrical connection from the top surface of said first interconnective layer to the bottom part of said first interconnective layer.

15. The method of claim 14 and further comprising the step of patterning said first interconnective layer to form a conducting path between said first region and a second region.

16. A method of forming a microelectronic device, said device incorporating connecting structures between regions, the method comprising:
a. providing a substrate having a first region;
b. forming a first insulating layer over said substrate;
c. removing selected portions of said first insulating layer so as to at least partially expose said region, thereby forming an opening above said exposed region, said opening having sidewalls of a first selected height to width ratio;
d. forming a conductive bottom part of a first interconnective layer upon said insulating layer and upon the sidewalls of said opening;
e. forming a top part of said first interconnective layer upon said bottom part, said top part being a semiconductor layer formed such that a cavity is defined by said first interconnective layer, comprising said top and bottom parts, upon the sidewalls of said opening; and
f. forming an insulating plug upon said first interconnective layer and within said cavity, said insulating plug partially filling said cavity and acting as a mask to subsequent doping operations thereby preventing dopants from said subsequent doping operations from penetrating to said first region;
g. doping the top part of said first interconnective layer to form an electrical connection from the top surface of said first interconnective layer to the bottom part of said first interconnective layer;
h. patterning said first interconnective layer to form a conducting path between said first region and a second region.

* * * * *